(12) United States Patent
Barnaby et al.

(10) Patent No.: US 9,874,591 B2
(45) Date of Patent: Jan. 23, 2018

(54) SUBSEA DEPLOYED APPARATUS AND METHOD

(71) Applicant: Viper Innovations Ltd, Portishead, Bristol (GB)

(72) Inventors: Terry Barnaby, Bristol (GB); Martin Thomas, Briston (GB)

(73) Assignee: Viper Innovations Ltd, Bristol (GB)

( * ) Notice: Subject to any disclaimer, the term of this patent is extended or adjusted under 35 U.S.C. 154(b) by 469 days.

(21) Appl. No.: 13/946,405

(22) Filed: Jul. 19, 2013

(65) Prior Publication Data
US 2014/0021962 A1    Jan. 23, 2014

(30) Foreign Application Priority Data

Jul. 20, 2012 (GB) .................................. 1212868.2
Nov. 16, 2012 (GB) .................................. 1220660.3

(51) Int. Cl.
*G01R 31/02* (2006.01)
*G01R 31/08* (2006.01)

(52) U.S. Cl.
CPC .......... *G01R 31/025* (2013.01); *G01R 31/021* (2013.01); *G01R 31/08* (2013.01)

(58) Field of Classification Search
CPC ....... G01R 31/02; G01R 31/08; G01R 31/025
USPC ........................................................ 324/509
See application file for complete search history.

(56) References Cited

U.S. PATENT DOCUMENTS

| 4,857,830 | A | * | 8/1989 | Matsuno | 324/707 |
| 5,276,401 | A | * | 1/1994 | Soma et al. | 324/551 |
| 5,469,066 | A | * | 11/1995 | Ito et al. | 324/551 |
| 5,883,517 | A | | 3/1999 | Broyde | |

(Continued)

FOREIGN PATENT DOCUMENTS

| CN | 202512225 | 10/2012 |
| EP | 1536243 | 6/2005 |

(Continued)

OTHER PUBLICATIONS

Search Report for GB1212868.2 dated Oct. 25, 2012.
Search Report for GB1220660.3 dated Mar. 8, 2013.
Search Report for GB1312544.8 dated Dec. 30, 2013.

*Primary Examiner* — Jeff Natalini
(74) *Attorney, Agent, or Firm* — Andrus Intellectual Property Law, LLP

(57) ABSTRACT

An apparatus includes a voltage source, voltage measurement means and a processing means, and connects to a line to apply and monitor a voltage between the line and earth. The processing means controls the voltage source to transmit and receive communications from the line, via the voltage measurement means. The apparatus also has a first and second current measurement means. The voltage source is connectable to a wire under test to inject a predetermined test voltage on the wire. The wire extends in a first and second direction from the test location. The first current measurement means measures the leakage current from the voltage source flowing along the wire in a first direction, and the second current measurement means determines the leakage current along the wire in a second direction, and the processing means uses the current flows measured by both current measurement means to determine wire insulation properties.

24 Claims, 3 Drawing Sheets

(56) References Cited

U.S. PATENT DOCUMENTS

| | | | |
|---|---|---|---|
| 6,433,558 B1 * | 8/2002 | Sciacero et al. | 324/628 |
| 2003/0160619 A1 * | 8/2003 | Parker | 324/536 |
| 2004/0156602 A1 | 8/2004 | Verhaege et al. | |
| 2005/0127891 A1 | 6/2005 | Bae | |
| 2008/0211314 A1 * | 9/2008 | Swan | 307/104 |
| 2009/0012372 A1 * | 1/2009 | Burnett et al. | 600/300 |
| 2010/0131215 A1 * | 5/2010 | Kim | 702/58 |
| 2012/0098546 A1 * | 4/2012 | Stokes | G05B 23/0256 |
| | | | 324/511 |

FOREIGN PATENT DOCUMENTS

| | | |
|---|---|---|
| EP | 1586910 | 10/2005 |
| GB | 2476152 | 6/2011 |
| JP | 2005062124 | 3/2005 |
| WO | 0239050 | 5/2005 |

\* cited by examiner

SUBSEA DEPLOYED APPARATUS AND METHOD

The present invention relates to a subsea deployed apparatus and method. In particular it relates to a method and apparatus for measuring line insulation properties and to a method and apparatus for communication. More specifically, but not exclusively, the present invention relates to measuring line insulation properties of subsea equipment, such as that used in oil and gas well control equipment.

It is frequently necessary to sleeve an electrically conducting wire with an electrically insulating material, for example to prevent electrical coupling between adjacent wires, or to a conducting medium within which the wire is disposed. Because the proper functioning of the insulation material is important, it is known to monitor its state, for instance by measuring insulation resistance, insulation capacitance or polarisation index.

In subsea applications, insulated wires are used in the electrically conducting medium of seawater, and the insulation material prevents electrical losses through the seawater, as well as fulfilling a number of other functions. One of the most common causes of failure of subsea systems is a failure of electrical insulation resulting from seawater ingress. Such a failure may lead to short circuits between conductors and/or current flows from live conductors to earth.

These types of failure can eventually lead to total loss of subsea electrical control and hence to an unplanned shutdown of production from one or more wells. Presently known solutions to the problem rely heavily on intervention to disconnect subsea equipment, cables and connectors and to replace with new until the fault is found or removed. Such intervention is a very inefficient, time consuming, and expensive way of fault finding.

U.S. Pat. No. 5,883,517, JP2005062124 and EP1586910 disclose a number of prior art arrangements for measuring line insulation properties in subsea networks. U.S. Pat. No. 5,883,517 relates to measurement of the properties of a communications line and involves recording some measurements, comparing the measured data with data representative of the line when in a known condition, and ascertaining from the comparison whether or not the line is faulty. JP2005062124 describes an arrangement for measuring insulation resistance at a number of locations along a line, and comparing the measurements with one another to identify the location of a fault. EP1586910 discloses an arrangement in which a DC offset is applied to a system prior to the application of one or more measurement pulses to permit the measurement of the insulation resistance.

A need exists for a method and apparatus that is capable of measuring insulation properties that improves the ease with which insulation faults can be located and addressed. Preferably, any measurement techniques used should be suitable for use on a live wire, and be able to localise a fault without first electrically isolating regions of the wire. This is advantageous as electrical isolation can only be achieved by either a manual disconnection using a diver or remotely operated vehicle (ROV), which is inconvenient and requires the system to be shut down, or by the incorporation of a mechanical switch in the device which could fail in the open position and which would then require a system shut down. Furthermore, manual disconnection could lead to damage of the connector during disconnection and reconnection.

It is further preferable that the measurement technique be accurate and robust, and suitable for use on transformer coupled wires (see, for example, FIG. 5a) as well as those connected via bus bars (see, for example, FIG. 5b). FIGS. 5a and 5b are simplified diagrams illustrating these distribution and connection methodologies.

An apparatus and method suitable for providing subsea communications is also desirable. Preferably the method will be capable of being performed using similar or identical equipment to that used for measuring insulation properties. An apparatus capable of both measuring line insulation properties and communication would be useful.

Copending British Patent Application publication no GB2476152 describes a subsea line insulation monitoring device. The arrangement described herein represents improvements and enhancements to the arrangement described in that application, and may, if desired, be used in conjunction therewith.

According to the present invention, there is provided an apparatus for communication, comprising a voltage source, voltage measurement means and a processing means; wherein the voltage source is connectable to a line to apply a voltage between the line and an earth, the voltage measurement means connectable to the line to monitor the voltage between the line and earth, and the processing means is configured to control the voltage source to transmit communications on the line, and to receive communications from the line via the voltage measurement means.

The apparatus may be configured for sub-sea use. The line may be, for example, a power line. In such an arrangement, the power line may live and may be arranged to carry, for example, an AC power voltage of, for example, at least 100V. However, it will be appreciated that this is merely one example and that other arrangements are possible without departing from the scope of the invention.

The apparatus may further comprise a first and second current measurement means, wherein the voltage source is connectable to a wire under test to inject a predetermined test voltage on the wire at a test location, the wire extending in a first and second direction away from the test location, the first current measurement means is configured to measure the leakage current from the voltage source flowing along the wire in a first direction, the second current measurement means is used to determine the leakage current from the voltage source flowing along the wire in the second, opposite direction, and the processing means is configured to use the current flows measured by the first and second current measurement means to determine wire insulation properties. The processing means is conveniently capable of determining insulation properties in both directions and determining the total insulation resistance.

The apparatus may be arranged such that the first current measurement means is configured to measure the total leakage current injected on the wire from the voltage source, and the leakage current from the voltage source flowing along the wire in the said first direction is determined by subtraction of the measured leakage current from the voltage source flowing along the wire in a second direction from the measured the total leakage current injected on the wire from the voltage source.

Alternatively, the first current measurement means may be arranged to directly measure the leakage current from the voltage source flowing along the wire in the said first direction.

Such an apparatus allows the location of insulation breakdowns in a system with which the apparatus is used to be identified. The location of such breakdowns relative to the apparatus, ie whether any such breakdowns are located in the first or second directions relative to the apparatus, can be determined. In this context, upstream and downstream are intended to be interpreted in relation to the direction of flow of electrical current.

The wire insulation properties may include at least one of: a total wire insulation resistance, an insulation resistance for the portion of the wire extending in the first direction, an insulation resistance for the portion of the wire extending in the second direction, a total leakage current from the voltage source, a leakage current from the voltage source flowing along the wire in a first direction, and a leakage current from the voltage source flowing along the wire in a second direction.

The apparatus may further comprise a voltage measurement means for monitoring the voltage injected on the wire by the voltage source, wherein the processing means uses the measured voltage to calculate wire insulation resistance.

The test voltage is preferably an AC voltage. It may have a DC offset.

The wire under test may carry an AC voltage, in use, with a line frequency, and the test voltage preferably has a frequency that is not related harmonically to the line frequency. As a result, operating interference can be reduced. The test voltage frequency is preferably in the range of 0-300 Hz. By way of example, it may be approximately 43 Hz.

However, it will be appreciated that this is merely one example, and that depending upon the line frequency, it may be preferred to use other test voltage frequencies.

The processing means may comprise an analogue to digital converter and a digital signal processor, and may be configured to use at least one of: fast Fourier transforms, finite impulse response filtering, averaging after filtering, and correlation.

The voltage source is preferably programmable, and configurable to output an arbitrary time sequence of predetermined voltages. In addition to being configured to transmit communications using the voltage source and receive communications using the voltage measurement means, other communications techniques are envisaged. The communications which are transmitted and/or received may include data from a range of sources, including both apparatus in accordance with the invention and devices falling outside of the scope of the invention. The apparatus may serve as a data hub for other subsea located instruments or devices. Communications between the apparatus of the invention and the other subsea located instruments or devices may be via physical electrical connection, or wireless means including acoustic, inductive, electromagnetic and optical.

The first and/or second current measurement means may comprise current measurement transformers and/or Hall Effect sensors.

A line bleed power source may be provided for converting a line voltage on the wire to a DC voltage for the apparatus. The power source may be a resistive or capacitive transformerless power supply. However, transformer based power sources are also envisaged.

An inductive power source may be provided configured to be powered by a remote inductive device.

A power storage means may be provided for storing energy.

The apparatus preferably further comprises data storage means for storing, for example, wire insulation property data. The data storage means may additionally or alternatively store data relating to other parameters, for example line voltage, line current and/or other measured parameters, and/or operating status/diagnostic data relating to the operation of the apparatus.

Preferably, several devices in accordance with the invention are installed within a subsea distribution network thus providing discrete insulation resistance measurements at system nodes. Importantly the apparatus allows a plurality of such devices to co-exist in the system or network without interfering with one another.

Preferably, a data collection device is connected to the system to gather the data transmitted by each apparatus. The data collection device may be located subsea, but preferably is located at a surface host facility thus allowing data retrieval without further subsea activities by diver or ROV.

The data collection device may preferably include measuring circuitry similar to that in the apparatus of the invention thus enabling insulation resistance of the umbilical and moreover the entire installed subsea system to be measured.

It will be appreciated that, ideally, a surface located data collection device or hub is provided and that a subsea apparatus in accordance with the invention is installed on each leg of the subsea system. However, in some arrangements the subsea apparatus may be deployed only at, for example, strategically significant locations in the system rather than in each leg thereof.

According to another aspect of the invention there is provided an apparatus for measuring wire insulation properties, comprising a first and second current measurement means, a voltage source and a processing means, wherein the voltage source is connectable to a wire under test to inject a predetermined test voltage on the wire at a test location, the wire extending in a first and second direction away from the test location, the second current measurement means is configured to measure the leakage current from the voltage source flowing along the wire in a first direction, the first current measurement means is used to determine the leakage current from the voltage source flowing along the wire in the second, opposite direction, and the processing means is configured to use the current flows measured by the first and second current measurement means to determine wire insulation properties.

The apparatus may incorporate many of the features outlined hereinbefore.

The invention will further be described, by way of example, with reference to the accompanying drawings, in which.

Figure 1:
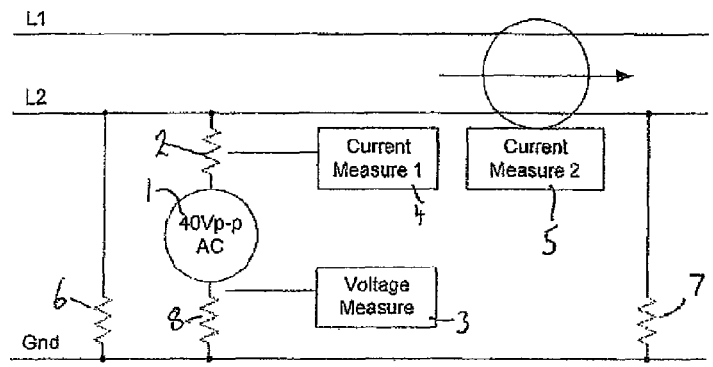
FIG. 1 is a schematic circuit diagram of an insulation measurement resistance circuit of an apparatus according to an embodiment of the invention.

Referring to FIG. 1, an insulation resistance measurement circuit is shown, for use in detecting the insulation resistance of two subsea electrical lines, L1 and L2. For convenience, the diagram illustrates the leakage of current from the line L2 to a ground line Gnd. However, it will be appreciated that the leakage may, in use, actually be to, for example, sea water or other electrically conductive media.

The circuit comprises a programmable voltage source 1 which is connected between the ground line Gnd and the line L2 through a protection resistor 8 of high electrical resistance. The connection of the voltage source 1 to the line L2 is part way along the length of the line L2, thus line L2 extends in a first direction towards, for example, a distribution unit and umbilical (not shown) and in a second direction towards, for example, a subsea located piece of equipment. A first portion of line L2 extending in the first direction has a leakage resistance 6, and a second portion of line L2 extending in the second direction has a leakage resistance 7. The leakage resistances may be made up of, for example, the resistance of the insulator associated with the line L2, and devices to which the line L2 is connected. As mentioned above, although illustrated diagrammatically as connecting to the ground line Gnd, it will be appreciated that the leakage resistances 6, 7 may take a range of forms.

In an AC test mode, the test signal from voltage source 1 has a frequency of, for example, 43 Hz, and is, for example, 40V peak to peak. Using a test signal frequency near to the conventional electrical power frequency of 50 Hz allows the use of standard components, for instance standard current measurement transformers for measuring the signal. Furthermore, by using a frequency which is close to, but not equal to, the line frequency and is not a harmonic of the line frequency, interference with the operation of frequency dependent devices and/or communications systems is minimised. A voltage measurement means 3 monitors the voltage of the test signal output by the voltage source 1 to the line L2.

A first current measurement device 2, 4 measures the current injected from the voltage source 1 onto line L2. This current will represent the total leakage current through both leakage resistances 6 and 7. The total insulation or leakage resistance for line L2 is determined by Ohm's law from the total leakage current as measured by the first current measurement device 2, 4 and the voltage of the test signal applied to line L2 as measured by the voltage measurement means 3. It will be appreciated that when the combined leakage resistance is much larger than the protection resistor 8 (as it should be), very little voltage is dropped across the protection resistor 8, and the voltage of the test signal on line L2 is substantially the same as the voltage output from the voltage source 1, as monitored by the voltage measurement means 3.

A second current measurement device 5 is connected to L2, at a location offset from the connection between the connection of line L2 to the voltage source 1, and measures the leakage current flowing through the portion of L2 that extends in the second direction. The insulation resistance of the second portion of line L2 can be calculated from this leakage current and the applied voltage. Kirchhoff's law allows the leakage current flowing in the first portion of L2 to be determined by subtracting the current flow measured by the second current measurement means 5 from that measured by the first 4. The insulation resistance for the first portion of L2 can then be calculated in a similar manner to the other insulation resistances.

It will be appreciated that both of the first and second current measurement means 4, 5 could comprise current measurement transformers. However, this need not always be the case, and FIG. 1 illustrates the case where just the second current measurement means 5 comprises such a transformer. In other embodiments they may comprise other suitable transducers, such as Hall Effect sensors. As shown in FIG. 1, the current measurement transformer serving as the second current measurement means 5 conveniently has both the line L2 and the line L1 passing through the coil thereof. As a result, the currents passing along the lines L1 and L2 between the distribution unit and umbilical and the subsea located equipment will largely cancel one another out leaving the current measurement transformer largely sensitive to the part of the current arising from the application of the test voltage from the voltage source 1, providing an accurate current measurement and so providing an accurate indication of the direction (upstream or downstream) relative to the insulation measurement circuit of a fault.

Whilst FIG. 1 illustrates the voltage source 1 and associated voltage measurement means 3 and current measurement means 2, 4 connected to the line L2, it will be appreciated that similar means may be associated with the line L1 to permit the detection of insulation resistance faults associated therewith.

The use of an AC test signal allows signal processing techniques to be used to reject any DC offsets that may be present in the measurement system that would be detrimental to accuracy in conventional DC measurement of insulation resistance. An analogue to digital converter and a digital signal processor allows techniques such as fast Fourier transforms, finite impulse response filtering, and correlation to be used to extract accurate leakage current measurements from the output of the first and second current measurement means 4, 5. It will be appreciated that these techniques require a plurality of measurements, and the accurate leakage current may thereby be calculated from a plurality of measurements made over time. The term digital signal processor as used herein relates to any device capable of processing a digital signal, and includes microprocessors and field programmable gate arrays.

In a DC test mode, the test signal from the voltage source 1 is a DC voltage, for instance 100V or 40V, allowing a standard insulation resistance measurement to be taken, based on the total leakage current and the applied voltage, as well as a measurement of the polarisation index (the ratio of the insulation resistance measured over 1 minute and 10 minutes with a DC voltage applied).

Figure 2:
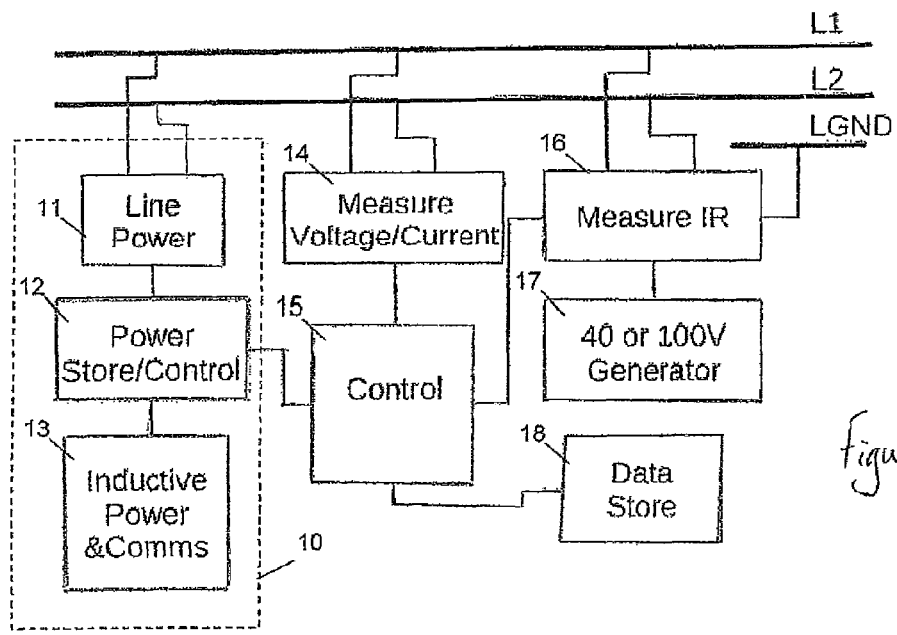
FIG. 2 is a block diagram of an embodiment of the invention.

Referring to FIG. 2, a block diagram of an apparatus according to the invention is shown, comprising a power supply 10, a voltage/current measurement block 14, a central control processor 15, an insulation resistance measurement block 16, a high voltage generator 17 and a data store 18. The apparatus is connected to two subsea electrical lines, L1 and L2.

The power supply 10 comprises a line power block 11, which is connected to both subsea lines L1 and L2, an inductive power/comms block 13 and a power store/control block 12.

The line power block 11 comprises, in this example a transformerless line power supply, which converts a small amount of line power from a relatively high AC voltage to a lower DC voltage suitable for operating the apparatus. However, transformer based arrangements are also envisaged. The line power voltage may for example be between 100V and 600V, and the line power block may sink less than 5 mA.

The inductive power/comms block 13 is configured to receive power and/or communicate inductively, for instance via an inductive wand which may be operated by a diver or remote operated vehicle. The inductive power/comms block 13 comprises a power receiving inductive coil with tuning and rectification components, for generating a DC voltage from a time varying magnetic field produced by a power providing coil. The DC voltage thereby generated may vary, for example as the relative position of the coils changes. The inductive power/comms block further comprises a large dynamic range (for example 6:1) switched mode power supply to regulate this variable voltage to an appropriate predetermined DC voltage range.

The inductive power/comms block 13 further comprises communication means for inductive communication between the power receiving coil and the power providing coil. The communication may be in either direction or in both. Alternatively, separate power transmission coils and communications coils may be provided. Furthermore, alternative communications means are envisaged, including (but not limited to) acoustic, electromagnetic and physical electrical connection with a connector based arrangements.

Both the line power block 11 and the inductive power/comms block 13 are connected to the power store/control block 12, which comprises a power storage means and a controller. The controller interfaces with the central control processor 15, and controls the power supply 10, including the communication functions of the inductive power/comms block 13. Line resistance measurements may be required relatively infrequently, but may require significant amounts of power over short durations. In order to meet the power requirements of such testing using the minimum power supplied from the line power block 11 and inductive power/comms block 13, the energy storage means is used to store energy, thereby supporting a higher power requirement with a shorter duty cycle. The power storage means may for example comprise a battery or supercapacitor.

The central control processor 15 is connected to the power store/control block, the voltage/current measurement block 14, the insulation resistance measurement block 16 and the data store 18, and is configured to control each of these blocks. The central control processor further performs processing on the data received from the measurement blocks 14, 16, and calculates insulation properties based on the measurements as described hereinbefore (for example using fast Fourier transforms, Ohm's and Kirchhoff's laws etc). The central control processor 15 may for example comprise a microprocessor.

The voltage/current measurement block 16 is configured to measure the voltage and current of lines L1 and L2, and the insulation resistance measurement block 16 is configured to measure the insulation of lines L1 and L2 as described hereinbefore. A high voltage generator 17 is connected to the insulation resistance measuring block for generating the test signal. The current of the test signal may be limited to comply with safety standards. It will be appreciated that when operating in an AC mode, the blocks 14, 15, 16, 17 may function in substantially the manner described hereinbefore with reference to FIG. 1, receiving power from the power supply 10.

Furthermore, by appropriate control over the operation of the generator 17, the waveform injected onto the lines L1, L2 may be adapted to carry communications signals which can be received and interpreted at a remote location. The communications signals may include data representative of the results of the line insulation tests. Furthermore, the communications signals may carry data received by way of the inductive power/comms block 13, and thus may be used to transmit signals unrelated to the line insulation tests. Indeed, the apparatus may be designed in such a manner as to permit just the transmission of such data, not incorporating line insulation monitoring functionality.

The data store is connected to the central control processor 15 for storing insulation properties, and is suitable for storing the results of periodic testing over a long duration, for example a year.

Figure 5B:
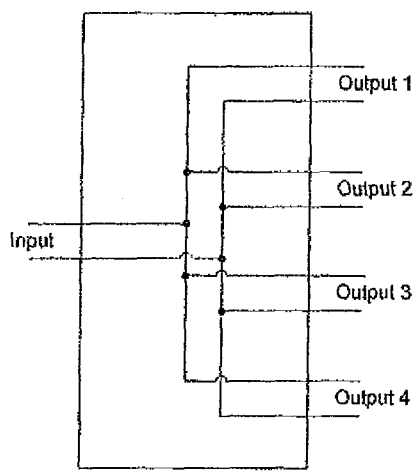
FIGS. 5a and 5b are diagrams illustrating distribution methodologies.
Figure 5A:
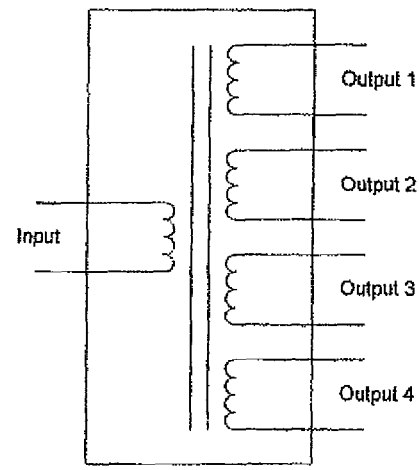

Apparatus according to an embodiment of the present invention which uses an AC signal to determine insulation resistance is capable of carrying out measurement on electrical lines connected to bus bars (for example as shown in FIG. 5b) as well as on lines which are coupled by transformers (for example see FIG. 5a). Using an AC test signal that is close in frequency to the line frequency means that the test signal will propagate well through standard transformers, and that conventional current measurement transformer components can be used to measure the signal. Ensuring that the AC test signal is not harmonically related to the line signal means that the test signal may readily be separated from the line signal using digital signal processing techniques such as Fourier transforms and finite impulse response filters. While digitally implemented techniques are preferred, analogue signal processing including filters may be employed to separate the test signal from noise. The test voltage frequency may be preset or set by a user, or may be selected by the apparatus by monitoring or determining the frequency of the line voltage and determining a suitable test voltage frequency for use therewith. The procedure for selecting the test voltage frequency may be repeated periodically, if desired, to ensure that the test is conducted at the optimum frequency.

Figure 3:
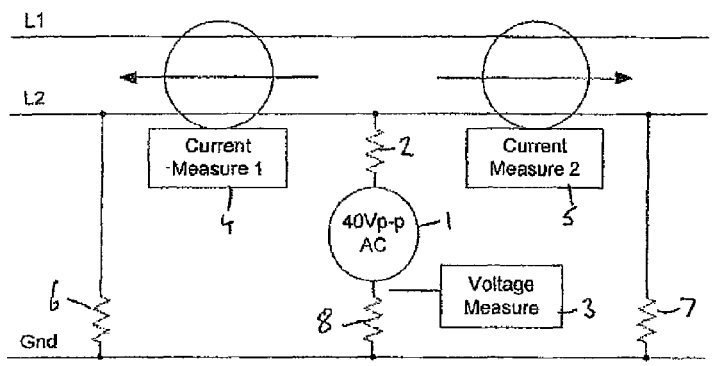
FIG. 3 is a view similar to FIG. 1 illustrating an alternative embodiment.

Whilst FIG. 1 illustrates an arrangement in which the total injected leakage current is measured, and leakage current in the second direction is measured, and the leakage current in the first direction is derived from these measurements, the invention is also applicable to arrangements in which the leakage current in the first direction is measured. For example, as shown in FIG. 3, the first current detection means 4 may be of a form substantially the same as the second current detection means 5, and may be arranged to measure the current in the line L2 flowing in the first direction. As the leakage current flowing in both directions is measured, there is no need to measure the total injected leakage current.

Although the embodiments shown have included a voltage measurement means, this is not an essential feature of the invention, and the programmable voltage source may instead be used to apply a predetermined voltage without voltage monitoring. It may be necessary to calibrate the voltage output from the voltage source under various conditions, and to correct for effects such as temperature to achieve an appropriate degree of precision for the voltage of the test signal.

Figure 4:
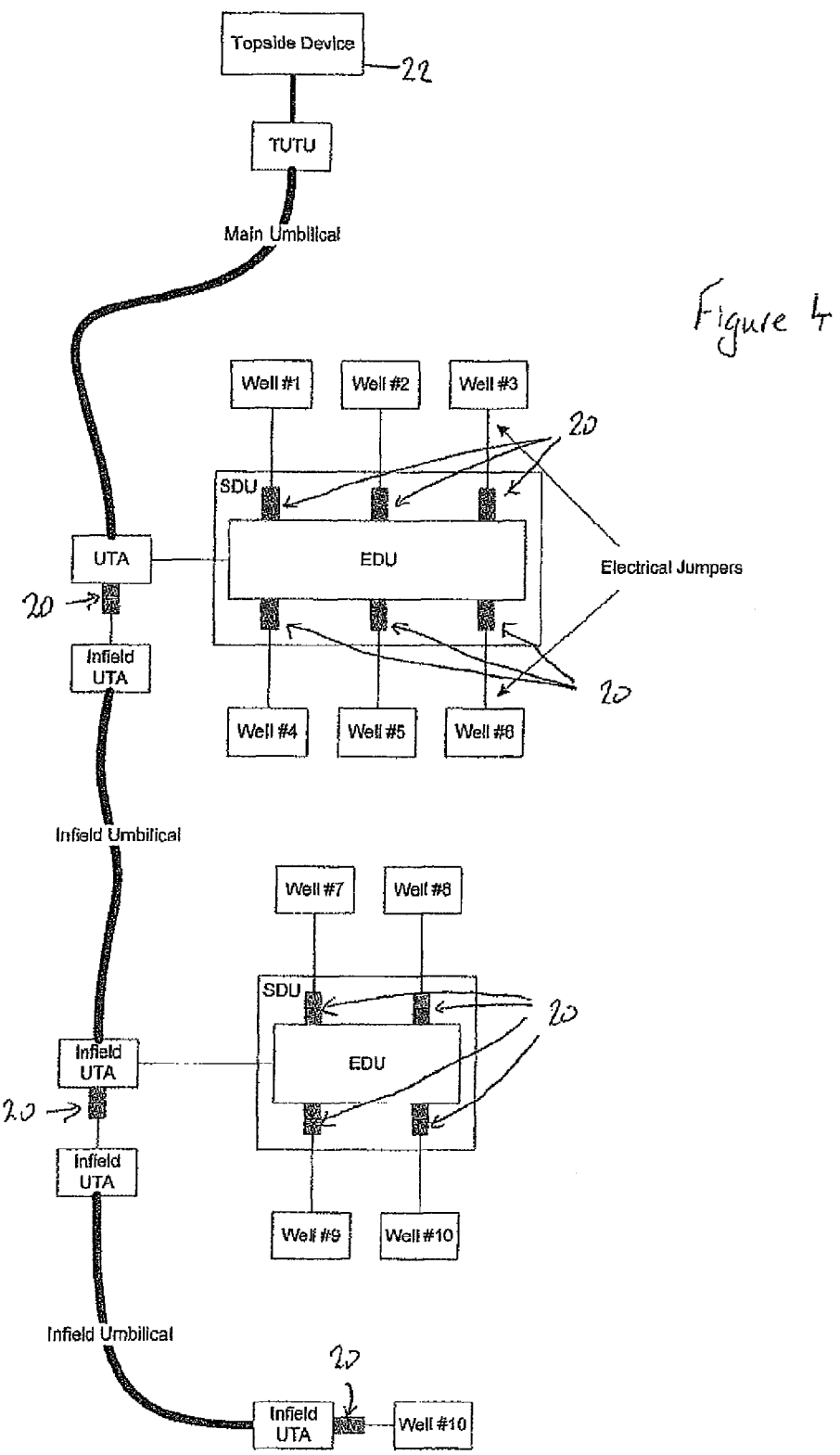
FIG. 4 is a diagram illustrating one application in which the apparatus may be used.

FIG. 4 illustrates one example of an application in which the invention may be employed. In FIG. 4, each location 20 is a location in which an apparatus in accordance with an embodiment of the invention is provided. The apparatus at each location 20 conveniently communicates using one of the techniques mentioned hereinbefore with a data gathering unit 22. Conveniently the data gathering unit 22 is located at the surface. However, this need not always be the case. Where the data gathering unit 22 is located at the surface, data recovery may be achieved in substantially real time without requiring the use of a diver or ROV.

The apparatus and method of the present invention determines insulation properties in a highly robust manner, and furthermore indicates in which portion of the wire under test the most current leakage is occurring (i.e. which has the lowest insulation resistance). This knowledge may be used to more rapidly identify the location of any problems with the wire, resulting in more rapid solutions to any problems. The invention is particularly applicable to subsea electrical lines, in which a loss of electrical insulation is a common cause of failure, and wherein the consequences of such failures may be particularly costly.

Although an embodiment has been described that is configured to measure line insulation properties, in other embodiments the apparatus may be configured only for communication. Such an apparatus may, for instance be used as a data collector for other devices, or more generally to provide a communication system operable through a single subsea power line.

One application in which the invention may be used is in the transmission of data to or from a subsea control unit. It is envisaged that the invention could provide a backup communications system for use in the event that, for example, a primary communications system were to fail, the invention providing a relatively low speed or low data rate emergency communications link. It could thus be used to provide continuing communications with safety critical instruments, for example providing data representative of the positions or statuses of safety critical valves or the like. However, this is just one possibility, and the invention may be used in other applications.

Whilst specific embodiments of the invention are described hereinbefore, it will be appreciated that a number of modifications and alterations may be made thereto without departing from the scope of the invention, as defined by the appended claims.

The invention claimed is:

1. An apparatus for communication of data signals on a line extending between a test location and a device independent of the apparatus and positioned at a location remote from the test location, the apparatus further being adapted for determination of wire insulation properties of the line at the test location, the apparatus being located at the test location and comprising a voltage source, a voltage measurement means and a processing means; wherein the voltage source is connectable to the line to apply a voltage between the line and an earth, the voltage measurement means connectable to the line to monitor the voltage between the line and earth, and the processing means is configured to control the voltage source to transmit data signals on the line between the test location and the device positioned at a location remote from the test location, the apparatus further comprising a current measurement means, the voltage source being connectable to the line under test of the line to inject a predetermined test voltage between the line at a test location and the earth, the current measurement means being configured to measure the leakage current from the voltage source flowing along the line, the processing means being configured to use the current flow measured by the current measurement means to determine wire insulation properties.

2. The apparatus according to claim 1, wherein the line is a power line.

3. The apparatus according to claim 1, wherein the line is a communications line.

4. The apparatus according to claim 1, wherein the apparatus is adapted for sub-sea use.

5. The apparatus according to claim 1 wherein the current measurement means comprises a first and second current measurement means, wherein:
the line extends in a first and second direction away from the test location,
the second current measurement means is configured to measure the leakage current from the voltage source flowing along the line in the second direction,
the first current measurement means is used to determine the leakage current from the voltage source flowing along the line in the first, opposite direction, and
the processing means is configured to use the current flows measured by the first and second current measurement means to determine wire insulation properties.

6. The apparatus of claim 5, wherein the first current measurement means directly measures the leakage current from the voltage source flowing along the line in the first direction.

7. The apparatus of claim 5, further comprising a voltage measurement means for monitoring the voltage injected on the line by the voltage source, wherein the processing means uses the measured voltage to calculate wire insulation resistance.

8. The apparatus of claim 5, wherein the line under test carries an AC voltage, in use, with a line frequency, and the test voltage has a frequency that is not related harmonically to the line frequency.

9. The apparatus of claim 8, wherein the test voltage frequency is determined by monitoring of the line frequency and selection of a test voltage frequency that is not harmonically related to the monitored line frequency.

10. The apparatus of claim 5, wherein the first and/or second current measurement means comprise current measurement transformers and/or Hall effect sensors.

11. The apparatus of claim 1, wherein the processing means comprises an analogue to digital converter and a digital signal processor.

12. The apparatus of claim 11, wherein the processing means is configured to use at least one of: fast Fourier transforms, finite impulse response filtering, averaging after filtering, and correlation.

13. The apparatus of claim 1, wherein the voltage source is programmable, and configurable to output an arbitrary time sequence of predetermined voltages.

14. The apparatus of claim 1, further comprising a line bleed power source for converting a line voltage on the line to a DC voltage for powering the apparatus.

15. The apparatus of claim 1, further comprising an externally mounted physical connector for communications and/or power transfer thereto and/or therefrom, which is induction based, acoustic based or optically based, whereby power and/or data signals can be supplied to or from the apparatus.

16. The apparatus of claim 1, further comprising an inductive power source configured to be powered by an inductive wand, whereby power can be supplied to the apparatus.

17. The apparatus of claim 1, further comprising a power storage means for storing energy from a power supply, power from the power storage means subsequently being used to power the apparatus.

18. The apparatus of claim 1, further comprising data storage means for storing data for subsequent analysis.

19. An apparatus for communication, comprising:
a voltage source;
voltage measurement means; and
a processing means;
wherein the voltage source is connectable to a line to apply a voltage between the line and an earth, the voltage measurement means being connectable to the line to monitor the voltage between the line and earth, and the processing means being configured to control the voltage source to transmit communications on the line, and/or to receive communications from the line, a first and second current measurement means, wherein:
the voltage source is connectable to the line under test to inject a predetermined test voltage on the line at a test location, the line extending in a first and second direction away from the test location, the second current measurement means is configured to measure the leakage current from the voltage source flowing along the line in a second direction, the first current measurement means is used to determine the leakage current from the voltage source flowing along the line in the first, opposite direction, and the processing means is configured to use the current flows measured by the first and second current measurement means to determine wire insulation properties; wherein:

the first current measurement means is configured to measure the total leakage current injected on the line from the voltage source, and the leakage current from the voltage source flowing along the line in the first direction is determined by subtraction of the measured leakage current from the voltage source flowing along the line in a second direction from the measured total leakage current injected on the line from the voltage source.

20. A method of communicating through a subsea electrical distribution system and measuring one or more of insulation resistance, voltage and current at one or more nodes of a subsea electrical distribution system using an apparatus comprising a voltage source, a voltage measurement means and a processing means, wherein the voltage source is connectable to a line of the system to apply a voltage between the line and an earth, the voltage measurement means is connectable to the line to monitor the voltage between the line and earth, and the processing means is configured to control the voltage source to transmit data signals and/or receive data signals transmitted on the line between the node and a device independent of the apparatus positioned at a location remote from the node, the apparatus further comprising a current measurement means, the voltage source being connectable to the line under test of the line to inject a predetermined test voltage between the line at the node and the earth, the current measurement means being configured to measure the leakage current from the voltage source flowing along the line, the processing means being configured to use the current flow measured by the current measurement means to determine wire insulation properties, the method comprising controlling the voltage source to transmit or receive communication data in the form of a voltage between the line and a ground along the line between the apparatus and the device.

21. The method of claim 20, further including communication of the measurement or measurements to a data gathering device.

22. The method of claim 20, further including communication between the apparatus and other subsea located devices and the storage and/or communication of the resultant data.

23. An apparatus for measuring wire insulation properties, comprising a first and second current measurement means, a voltage source and a processing means, wherein the voltage source is connectable to a line under test to inject a predetermined test voltage on the line at a test location, the line extending in a first and second direction away from the test location, the first current measurement means is configured to measure the leakage current from the voltage source flowing along the line in a first direction, the second current measurement means is used to determine the leakage current from the voltage source flowing along the line in the second, opposite direction, and the processing means is configured to use the current flows measured by the first and second current measurement means to determine wire insulation properties, wherein the first current measurement means is configured to measure the total leakage current injected on the line from the voltage source, and the leakage current from the voltage source flowing along the line in the first direction is determined by subtraction of the measured leakage current from the voltage source flowing along the line in a second direction from the measured total leakage current injected on the line from the voltage source.

24. A system comprising a data signals communications apparatus, and a line extending between a test location and a device independent of the apparatus and positioned at a location remote from the test location, the apparatus being located at the test location and further being adapted for determination of wire insulation properties of the line at the test location, the apparatus comprising a voltage source, a voltage measurement means and a processing means; wherein the voltage source is connectable to the line to apply a voltage between the line and an earth, the voltage measurement means connectable to the line to monitor the voltage between the line and earth, and the processing means is configured to control the voltage source to transmit data signals and/or receive data signals transmitted on the line between the test location and the device positioned at a location remote from the test location, the apparatus further comprising a current measurement means, the voltage source being connectable to the line under test of the line to inject a predetermined test voltage between the line at a test location and the earth, the current measurement means being configured to measure the leakage current from the voltage source flowing along the line, the processing means being configured to use the current flow measured by the current measurement means to determine wire insulation properties.

* * * * *